(12) United States Patent
Ji et al.

(10) Patent No.: US 10,580,755 B2
(45) Date of Patent: Mar. 3, 2020

(54) FAN-OUT WAFER LEVEL MULTILAYER WIRING PACKAGE STRUCTURE

(71) Applicants: Yong Ji, Jiangsu (CN); Rongzhen Zhang, Jiangsu (CN); Chongchong Mao, Jiangsu (CN)

(72) Inventors: Yong Ji, Jiangsu (CN); Rongzhen Zhang, Jiangsu (CN); Chongchong Mao, Jiangsu (CN)

(73) Assignee: The 58th Research Institute of China Electronics Technology Group Corporation, Wuxi, Jiangsu (CN)

( * ) Notice: Subject to any disclaimer, the term of this patent is extended or adjusted under 35 U.S.C. 154(b) by 0 days.

(21) Appl. No.: 16/044,496

(22) Filed: Jul. 24, 2018

(65) Prior Publication Data
US 2019/0051632 A1 Feb. 14, 2019

(30) Foreign Application Priority Data
Aug. 8, 2017 (CN) .......................... 2017 1 0668576

(51) Int. Cl.
*H01L 25/065* (2006.01)
*H01L 23/498* (2006.01)
(Continued)

(52) U.S. Cl.
CPC ...... *H01L 25/0655* (2013.01); *H01L 21/4857* (2013.01); *H01L 21/568* (2013.01); *H01L 23/49822* (2013.01); *H01L 23/49827* (2013.01); *H01L 23/49838* (2013.01); *H01L 23/5385* (2013.01); *H01L 24/32* (2013.01); *H01L 24/83* (2013.01); *H01L 23/3128* (2013.01); *H01L 23/49816* (2013.01); *H01L 23/5383* (2013.01); *H01L 23/5384* (2013.01); *H01L 25/043* (2013.01); *H01L 25/072* (2013.01);
(Continued)

(58) Field of Classification Search
CPC . H01L 25/043; H01L 25/0655; H01L 25/072; H01L 25/0753; H01L 25/115; H01L 23/5383–5386
See application file for complete search history.

(56) References Cited

U.S. PATENT DOCUMENTS 9,543,242 B1 * 1/2017 Kelly ................. H01L 23/49816
9,559,081 B1 * 1/2017 Lai ....................... H01L 25/0657
(Continued)

*Primary Examiner* — David A Zarneke

(57) ABSTRACT

A fan-out wafer level multilayer wiring package structure, wherein the package structure comprises a plurality of semiconductor chips, a multilayer interposer, a vertical interconnection interposer, molding materials and a redistribution layer; the back surface of the semiconductor chip is bonded to the back surface of the multilayer wiring interposer with the bonding material, and is placed on the same horizontal plane as the vertical interconnection interposer and packaged as a whole with the molding material, the redistribution layer is provided on the surface of the structure; the semiconductor chip, the multilayer interposer, the conductive material of the vertical interconnection interposer and the solder ball are connected by the conductive metal layer of the redistribution layer to achieve the signal interconnection between the semiconductor chip and the multilayer interposer and the I/O signal transfer of the semiconductor chip.

5 Claims, 2 Drawing Sheets

(51) Int. Cl.
  *H01L 23/00*   (2006.01)
  *H01L 21/48*   (2006.01)
  *H01L 21/56*   (2006.01)
  *H01L 23/538*  (2006.01)
  *H01L 23/31*   (2006.01)
  *H01L 25/04*   (2014.01)
  *H01L 25/07*   (2006.01)
  *H01L 25/075*  (2006.01)
  *H01L 25/11*   (2006.01)

(52) U.S. Cl.
  CPC ......... *H01L 25/0753* (2013.01); *H01L 25/115* (2013.01); *H01L 2224/32225* (2013.01); *H01L 2924/14* (2013.01)

(56) References Cited

U.S. PATENT DOCUMENTS

| | | | | |
|---|---|---|---|---|
| 9,620,482 | B1* | 4/2017 | Chen | H01L 25/0657 |
| 9,793,230 | B1* | 10/2017 | Yu | H01L 23/5389 |
| 9,818,684 | B2* | 11/2017 | Hiner | H01L 21/56 |
| 9,899,248 | B2* | 2/2018 | Yu | H01L 23/49811 |
| 10,032,722 | B2* | 7/2018 | Yu | H01L 21/6835 |
| 10,153,175 | B2* | 12/2018 | Lin | H01L 21/76834 |
| 10,165,835 | B2* | 1/2019 | Sunne | A44C 17/02 |
| 10,325,853 | B2* | 6/2019 | Yu | H01L 23/49838 |
| 2014/0131856 | A1* | 5/2014 | Do | H01L 21/481 257/737 |
| 2018/0012881 | A1* | 1/2018 | Scanlan | H01L 25/50 |
| 2019/0019756 | A1* | 1/2019 | Yu | H01L 21/4857 |

* cited by examiner

FAN-OUT WAFER LEVEL MULTILAYER WIRING PACKAGE STRUCTURE

BACKGROUND OF THE INVENTION

1. Field of the Invention

The invention belongs to the field of the packaging technology for integrated circuits, specifically relating to fan-out wafer level package.

2. Description of the Related Art

Fan-out wafer-level packaging technology, as a solution to the miniaturization and low-cost application of electronic system components, is currently developing into a major advanced packaging process with high integration flexibility. This technology can reduce weight by more than 40% without LTCC substrate; and wafer level integration can achieve micron-scale manufacturing precision, improve production efficiency, and meet the urgent needs of modern electronic equipment systems for miniaturization, low cost, and high integration. The key process technologies for fan-out wafer level packaging are solder bump fabrication and redistribution layer (RDL) technology. Among them, RDL technology is used to realize the signal interconnection between semiconductor chips and the transfer of signal terminals (I/O). As electronic systems become more powerful, their wiring and mounting density are also increasing. However, the RDL technology is limited by the number of wiring layers, making it difficult to meet the more complex design of the fan-out wafer level package.

In order to meet the wiring design requirements of current microelectronic systems, it is urgent to develop fan-out wafer level multilayer wiring package structure.

SUMMARY OF THE INVENTION

The invention provides fan-out wafer level multi-layer wiring package structure and a method for preparing the package structure, which are used to solve the problem that the fan-out wafer level package existing in the prior art is difficult to meet the complicated interconnection relationship.

Fan-out wafer level multilayer wiring package structure, wherein the package structure comprises a plurality of semiconductor chips, a multilayer interposer, a vertical interconnection interposer, molding materials and a redistribution layer;

the back surface of the semiconductor chip is bonded to the back surface of the multilayer interposer with the bonding material, and is placed on the same horizontal plane with the vertical interconnection interposer and packaged as a whole with the molding material, and the redistribution layer is provided on the surface of the structure;

the semiconductor chip, the multilayer interposer, the conductive material of the vertical interconnection interproser and the solder ball are connected by the conductive metal layer of the redistribution layer to achieve the signal interconnection between the semiconductor chip and the multilayer interposer and the I/O signal transfer of the semiconductor chip.

Furthermore, wherein the package structure realizes an increase in the number of wiring layers by the multilayer interposer; the multilayer interposer is manufactured by using the CMOS process according to the electrical interconnection design requirements of the system.

Furthermore, wherein the multilayer interposer combines with the semiconductor chip, then the combination and the vertical interconnection interposer are integrated after being placed on the same horizontal plane, to achieve the electrical interconnection between the semiconductor chip or the multilayer interposer and the conductive material of the vertical interconnection interposer and the solder ball by rewiring the conductive metal.

Furthermore, wherein the vertical interconnection interposer is obtained by cutting the corresponding size of the vertical interconnection interposer wafers fixed with the prefabricated through-hole pitch according to the electrical interconnection design requirements between the semiconductor chips.

A method for manufacturing fan-out wafer level package structure, wherein: the wafer level CMOS process is used to fabricate the multilayer interposer according to the signal interconnection design requirements between the semiconductor chips; the vertical interconnection interposer wafers fixed with the prefabricated through-hole pitch are cut with the wafer saw to obtain the corresponding size of the vertical interconnection interposer according to the signal interconnection design requirements between the semiconductor chips and the specific requirements for the number of signal leading-out terminals of the system; the back surface of the semiconductor chip is bonded to the back surface of the multilayer interposer by using the bonding process with the bonding material; the bonded semiconductor chip and multilayer interposer and the vertical interconnection interposer are temporarily bonded on a carrier, and the front surface of the semiconductor chip faces away from the carrier and the vertical interconnection interposer is placed on the side of the semiconductor chip and the multilayer interposer; the semiconductor chip, the multilayer interposer and the vertical interconnection interposer on the carrier are packaged, and then the carrier is removed; the redistribution layer (RDL) is provided on the surface of the above structure, and the signal I/O of the semiconductor chip is connected to the vertical interconnection interposer through the upper surface RDL, and then connected to the multilayer interposer through the conductive material of the vertical interconnection interposer and the lower surface RDL, or directly connected to the bottom solder ball through the conductive material of the vertical interconnection interposer.

According to the signal interconnection design requirements between the semiconductor chips, the multilayer interposer is provided to increase the number of wiring layers of the fan-out wafer level package, making up for the defect of the wafer level package limited by the number of redistribution layers, which can meet the development requirements for high-density and high-complexity wiring of current microelectronic systems and can be used for microsystem packaging with high complexity. The signal interconnection between the leading-out terminal (I/O) of the semiconductor chip and the multilayer interposer is realized by the vertical interconnection interposer at the side, thus simplifying the interconnection mode. The vertical interconnection interposer wafers fixed with the prefabricated through-hole pitch are cut to obtain the corresponding vertical interconnection interposer according to the signal interconnection design requirements between the semiconductor chips, thus simplifying and fixing the process and improving the packaging efficiency.

BRIEF DESCRIPTION OF THE DRAWINGS

In order to more clearly illustrate the technical solutions in the embodiments of the present invention, the drawings used in the description of the embodiments will be briefly described below. It is obvious that the drawings in the following description are only some embodiments of the present invention. Those skilled in the art can also obtain other drawings based on these drawings without paying for inventive labor.

Wherein, 1—semiconductor chip, 2—multilayer interposer, 3—redistribution layer, 4—molding material, 5—vertical interconnection interposer, 6—wiring layer of multilayer interposer, 7—bonding material, 8—solder ball, 9—carrier.

DETAILED DESCRIPTION OF THE PREFERRED EMBODIMENTS

In order to make the objects, technical solutions and advantages of the present invention more apparent, the present invention will be further described in detail below with reference to the accompanying drawings. It is apparent that the described embodiments are only a part of the embodiments of the invention, and not all of the embodiments. All other embodiments obtained by those skilled in the art based on the embodiments of the present invention without creative efforts are within the scope of the present invention.

The present invention is further described as follows with reference to the drawings.

Figure 3:
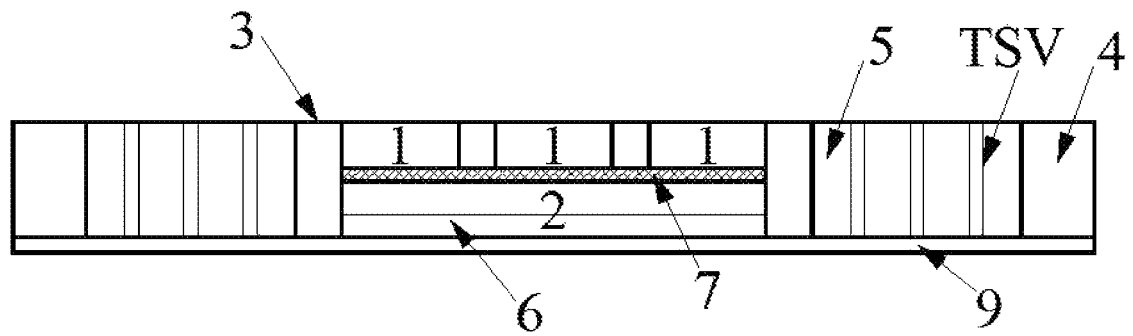
FIG. 3 is a schematic diagram showing the integration of the bonded semiconductor chip and multilayer interposer and the vertical interconnection interposer of fan-out wafer level multilayer wiring package structure according to the invention.
Figure 4:
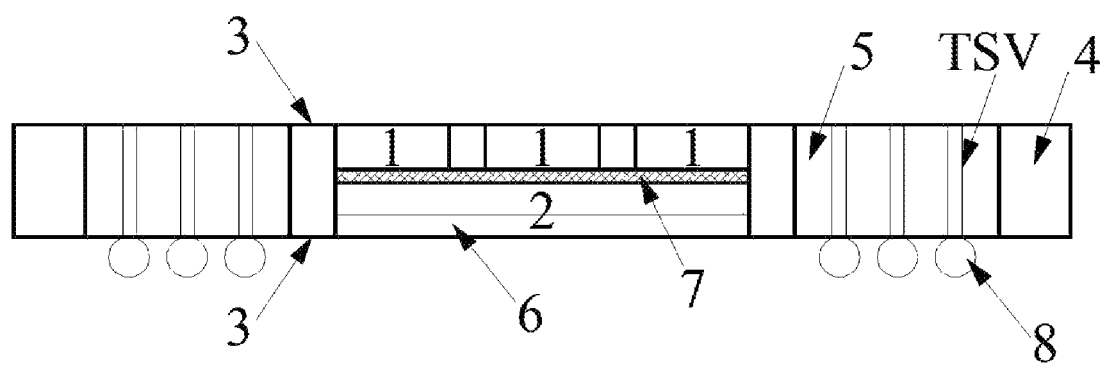
FIG. 4 is a schematic diagram of fan-out wafer level multilayer wiring package structure according to the invention.

As shown in FIG. 3, fan-out wafer level multilayer wiring package structure, wherein the package structure comprises a plurality of semiconductor chips 1, a multilayer interposer 2, a vertical interconnection interposer 5, molding materials 4 and a redistribution layer 3;

the back surface of the semiconductor chip 1 is bonded to the back surface of the multilayer interposer 2 with the bonding material 7, and is placed on the same horizontal plane as the vertical interconnection interposer 5 and packaged as a whole with the molding material 4, and the redistribution layer 3 is provided on the surface of the structure;

the signal I/O of the semiconductor chip 1 is connected to the vertical interconnection interposer 5 through the upper surface RDL, and then connected to the multilayer interposer 2 through the conductive material of the vertical interconnection interposer 5 and the lower surface RDL, or directly connected to the bottom solder ball 8 through the conductive material of the vertical interconnection interposer 2.

Furthermore, the package structure realizes an increase in the number of wiring layers by the multilayer interposer 2; the multilayer interposer 2 is manufactured by using the CMOS process according to the electrical interconnection design requirements of the system.

Furthermore, the multilayer interposer 2 combines with the semiconductor chip 1, then the combination and the vertical interconnection interposer 5 are integrated after being placed on the same horizontal plane, to achieve the electrical interconnection between the semiconductor chip 1 or the multilayer interposer 2 and the conductive material of the vertical interconnection interposer 5 and the solder ball 8 by rewiring the conductive metal.

Furthermore, the molding material 4 is one of the filler material, but not limited in the filler material.

Furthermore, the vertical interconnection interposer 5 is obtained by cutting the corresponding size of the vertical interconnection interposer 5 wafers fixed with the prefabricated through-hole pitch according to the electrical interconnection design requirements between the semiconductor chips 1.

Figure 1:
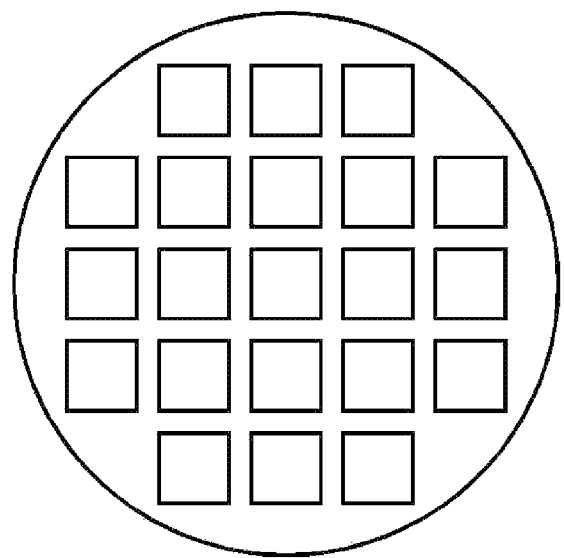
FIG. 1 is a multilayer interposer wafer of fan-out wafer level multilayer wiring package structure according to the invention.
Figure 2:
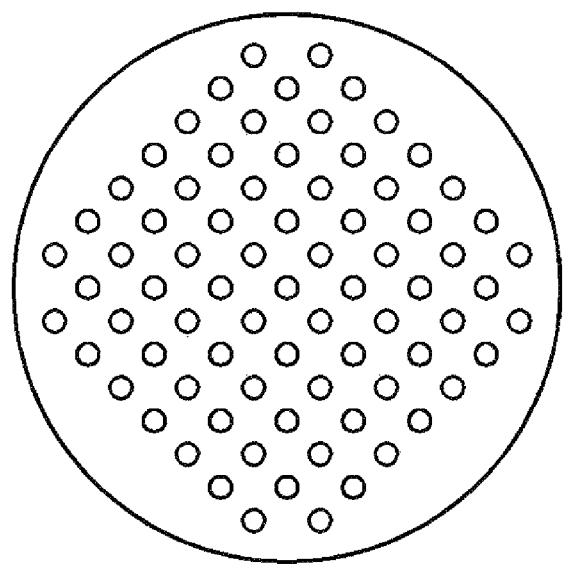
FIG. 2 is a vertical interconnection interposer wafer fixed with the prefabricated through-hole pitch of fan-out wafer level multilayer wiring package structure according to the invention.

A method for manufacturing fan-out wafer level package structure, including the following steps:

(1) the wafer level CMOS process is used to fabricate the multilayer interposer 2 according to the signal interconnection design requirements between the semiconductor chips 1;

(2) Using a high-efficiency technology, see the FIG. 2, the vertical interconnection interposer 5 wafers fixed with the prefabricated through-hole pitch are cut with the wafer saw to obtain the corresponding size of the vertical interconnection interposer 5 according to the signal interconnection design requirements between the semiconductor chips 1 and the specific requirements for the number of signal leading-out terminals of the system;

(3) the back surface of the semiconductor chip 1 is bonded to the back surface of the multilayer interposer 2 by using the bonding process with the bonding material 7;

(4) the bonded semiconductor chip 1 and multilayer interposer 2 and the vertical interconnection interposer 5 are temporarily mounted on a carrier 9, and the front surface of the semiconductor chip 1 faces away from the carrier 9 and the vertical interconnection interposer 5 is placed on the side of the semiconductor chip 1 and the multilayer interposer 2 (using the method of lateral vertical interconnect interposer);

(5) the semiconductor chip 1, the multilayer interposer 2 and the vertical interconnection interposer 5 on the carrier 9 are packaged, and then the carrier 9 is removed;

(6) the redistribution layer (RDL) 3 is provided on the surface of the above structure, and the signal I/O of the semiconductor chip 1 is connected to the vertical interconnection interposer 5 through the upper surface RDL, and then connected to the multilayer interposer 2 through the conductive material of the vertical interconnection interposer 5 and the lower surface RDL, or directly connected to the bottom solder ball 8 through the conductive material of the vertical interconnection interposer 5. The present invention increases the number of wiring layers of the fan-out wafer level package, making up for the defect of the wafer level package limited by the number of RDL wiring layers, which can meet the development requirements for high-density and high-complexity wiring of current microelectronic systems and can be used for microsystem packaging with high complexity.

Although the preferred embodiment of the invention has been described, it will be understood by the person who is professional in this technology field, the appended claims are intended to be interpreted as including the preferred embodiments and the modifications and modifications.

It will be apparent that those skilled in the art can make various modifications and variations to the invention without departing from the spirit and scope of the invention.

Thus, it is intended that the present invention cover the modifications and modifications of the invention.

What is claimed is:

1. A fan-out wafer level multilayer wiring package structure, wherein the package structure comprises a plurality of semiconductor chips, a multilayer interposer, a vertical interconnection interposer, molding materials and a redistribution layer;

a back surface of the plurality of semiconductor chip is bonded to a back surface of the multilayer interposer with a bonding material, and is placed on a horizontal plane with the vertical interconnection interposer and packaged as a whole with the molding material, and the redistribution layer is provided on a surface of the structure;

the plurality of semiconductor chip, the multilayer interposer, a conductive material of the vertical interconnection interproser and a solder ball are connected by a conductive metal layer of the redistribution layer to achieve a signal interconnection between the plurality of semiconductor chip and the multilayer interposer and an I/O signal transfer of the plurality of semiconductor chip.

2. The fan-out wafer level multilayer wiring package structure of claim 1, wherein the package structure realizes an increase in the number of wiring layers by the multilayer interposer; the multilayer interposer is manufactured by using a CMOS process according to an electrical interconnection design requirements of the system.

3. The fan-out wafer level multilayer wiring package structure of claim 1, wherein the multilayer interposer combines with the plurality of semiconductor chip, then a combination and the vertical interconnection interposer are integrated after being placed on the same horizontal plane, to achieve the electrical interconnection between the plurality of semiconductor chip or the multilayer interposer and a conductive material of the vertical interconnection interposer and a solder ball by rewiring a conductive metal.

4. The fan-out wafer level multilayer wiring package structure of claim 1, wherein the vertical interconnection interposer is obtained by cutting the vertical interconnection interposer wafers fixed with a prefabricated through-hole pitch according to an electrical interconnection design requirements between the semiconductor chips.

5. A method for manufacturing a fan-out wafer level package structure, wherein:

a wafer level CMOS process is used to fabricate a multilayer interposer according to a signal interconnection design requirements between the plurality of semiconductor chip;

a vertical interconnection interposer wafers fixed with a prefabricated through-hole pitch are cut with a wafer saw to obtain a vertical interconnection interposer according to a signal interconnection design requirements between the plurality of semiconductor chip and a specific requirements for the number of signal leading-out terminals of a system;

a back surface of the plurality of semiconductor chip is bonded to the back surface of a multilayer interposer by using a bonding process with a bonding material;

a bonded semiconductor chip and multilayer interposer and the vertical interconnection interposer are temporarily bonded on a carrier, and a front surface of the semiconductor chip faces away from the carrier and the vertical interconnection interposer is placed on a side of the semiconductor chip and the multilayer interposer;

the semiconductor chip, the multilayer interposer and the vertical interconnection interposer on the carrier are packaged, and then the carrier is removed;

the redistribution layer is provided on the surface of the above structure, and the signal I/O of the semiconductor chip is connected to the vertical interconnection interposer through the upper surface RDL, and then connected to the multilayer interposer through the conductive material of the vertical interconnection interposer and the lower surface RDL, or directly connected to the bottom solder ball through the conductive material of the vertical interconnection interposer.

* * * * *